United States Patent [19]
Yano et al.

[11] Patent Number: 5,950,101
[45] Date of Patent: Sep. 7, 1999

[54] METHOD FOR MANUFACTURING A SEMICONDUCTOR DEVICE INVOLVING FORMING TWO SILICON OXIDE LAYERS BY CVD AND FORMING HMDS BETWEEN THE SILICON OXIDE LAYERS

[75] Inventors: Kousaka Yano; Tatsuo Sugiyama; Satoshi Ueda, all of Osaka; Noboru Nomura, Kyoto, all of Japan

[73] Assignee: Matsushita Electric Industrial Co., Ltd., Osaka, Japan

[21] Appl. No.: 08/888,919

[22] Filed: Jul. 7, 1997

Related U.S. Application Data

[62] Division of application No. 08/712,237, Sep. 11, 1996, Pat. No. 5,723,909, which is a continuation of application No. 08/293,320, Aug. 22, 1994, abandoned.

[30] Foreign Application Priority Data

Aug. 23, 1993 [JP] Japan ................................. 5-207950

[51] Int. Cl.$^6$ ................................. H01L 21/469
[52] U.S. Cl. ..................... 438/618; 438/624; 438/789
[58] Field of Search ..................... 438/618, 761, 438/782, 789, 669, 644, 624, 631, 626, 790

[56] References Cited

U.S. PATENT DOCUMENTS 4,885,262  12/1989  Ting et al. .
5,576,247  11/1996  Yano et al. .
5,605,867   2/1997  Sato et al. .

*Primary Examiner*—Caridad Everhart
*Attorney, Agent, or Firm*—McDermott, Will & Emery

[57] ABSTRACT

A first metallization layer is locally formed on the surface of a semiconductor substrate thereby leaving portions of the semiconductor substrate's surface exposed. A first silicon oxide layer is then formed in such a manner that it covers the exposed portions of the semiconductor substrate's surface and the first metallization layer. This is followed by the formation of an HMDS molecular layer on the first silicon oxide layer. Then, a second silicon oxide is formed on the molecular layer by means of a CVD process utilizing the chemical reaction of ozone with TEOS. Finally, a second metallization layer is locally formed on the second silicon oxide layer.

6 Claims, 14 Drawing Sheets

METHOD FOR MANUFACTURING A SEMICONDUCTOR DEVICE INVOLVING FORMING TWO SILICON OXIDE LAYERS BY CVD AND FORMING HMDS BETWEEN THE SILICON OXIDE LAYERS

This is a divisional of application Ser. No. 08/712,237, now U.S. Pat. No. 5,723,909 Sep. 11, 1996, which is a File Wrapper Continuation of Ser. No. 08/293, 320, filed Aug. 22, 1994, now abandoned.

BACKGROUND OF THE INVENTION

The present invention generally relates to a semiconductor device and associated semiconductor device fabrication method, and, more particularly, to a technology for providing, in the VLSI (very-large-scale integrated circuit) multilevel metallization formation steps, an interlayer dielectric film having an excellent uniformity of film thickness.

As the scale of semiconductor device integration increases and device dimensions decreases, demand for sophisticated multilevel metallization technology becomes higher and higher. The interlayer dielectric film serving as an insulator therefore plays an important role to provide a conformal step coverage to the walls and bottom of a fine step of a first metallization layer having a high aspect ratio, and, recently, an atmospheric-pressure chemical vapor deposition (APCVD) method utilizing the reaction of tetra-ethyl-ortho-silicate (TEOS) with ozone ($O_3$) has been in intensive research, since TEOS deposition provides a good step coverage.

Referring now to the accompanying drawings, a conventional semiconductor device fabrication process is described. FIGS. 11a–c show subsequent steps of the fabrication of a conventional semiconductor device. Formed on semiconductor substrate 10 are LOCOS film 11 for insulation/separation, polysilicon gate electrode 12, boron oxide/phosphorus oxide-containing $SiO_2$ layer 13 (hereinafter called "BPSG layer"), source (or drain) region 14 that is an impurity-diffused region, tungsten source (or drain) electrode 15, and first metallization layer 16 that is an aluminum alloy layer having a content of about 1% silicon and about 0.5% capper. In addition, gate insulating layer 17 is shown in FIG. 11c.

$SiO_2$ layer 21 (hereinafter called "P-TEOS layer") is first deposited on first metallization layer 16 by means of a plasma CVD process from a TEOS source gas (see FIG. 11b).

Next, $SiO_2$ layer 22 (hereinafter called "TEOS-$O_3$ layer") is deposited by means of an APCVD process making use of the reaction of TEOS with $O_3$. This is followed by the formation of second metallization layer 23 on TEOS-$O_3$ layer 22 (see FIG. 11c).

The above-described APCVD utilizing the reaction of TEOS with ozone much depends on the underlying topography. Suppose that an underlaying layer, or P-TEOS layer 21 has different types of film properties, namely a hydrophilic (water-loving) region and a hydrophobic (water-hating) region and TEOS-$O_3$ layer 22 is deposited on such P-TEOS layer 21. In this case, TEOS-$O_3$ layer 22 suffers some problems such as the differences in the formation rate and film property between a part of TEOS-$O_3$ layer 22 overlying the hydrophilic region of P-TEOS layer 21 and another part overlying the hydrophobic region. These problems are described below in detail.

FIG. 12 theoretically depicts the profile of P-TEOS layer 21 deposited on first metallization layer 16. As seen from FIG. 12, P-TEOS layer 21 has a project part where first metallization layer 16 underlies and a recess part between first metallization layers 16. The project part, because it stands tall, is exposed intensively to ion species and electrons when a plasma CVD process is being performed. As a result, good inter-atom bonding between Si and O occurs in such a projecting surface layer, thereby producing a surface layer state having a less number of dangling bonds or "arms". Generally, dangling bonds join to hydroxyl groups (—OH), in air. In contrast, the recess part is less exposed to ion species and electrons as compared with the project part, thereby creating a greater number of dangling bonds which bond to "—OH" groups upon exposure to air. To sum up, if P-TEOS layer 21 has different types of surface states, this makes the film thickness of TEOS-$O_3$ layer 22 vary.

The conventional semiconductor device fabrication process has several drawbacks. Because of the difference in material between P-TEOS layer 21 and TEOS-$O_3$ layer 22, or because of the concurrent existence of a hydrophilic region and a hydrophobic region in an underlying layer, the film formation rate and film properties of TEOS-$O_3$ layer 22 vary. As a result, the surface of TEOS-$O_3$ layer 22 becomes uneven, and its surface property gets worse.

There have been proposed techniques of exposing P-TEOS layer 21 to a $N_2$-gas plasma, and some of them are shown in the following literature.

1) K. Fujino, Y. Nishimoto, N. Tokumasu, and K. Maeda, "Surface Modification of Base Materials for TEOS/$O_3$ Atmospheric Pressure Chemical Vapor Deposition," J. Electrochem. Soc., Vol. 139, No. 6 (1992) p. 1690.
2) N. Sato, Y. Ohta, T. Hashimoto, A. Kotani, and M. Ishihara, "TEOS-$O_3$ APCVD $SiO_2$ Dependence Upon Underlying Topography," '92 39th Applied Physics Society Spring Meeting Draft Collection, 29a-ZG-4, p. 646.
3) H. Kotani, and Y. Matsui, "Organo-Silicon CVD technology," Semiconductor Research 36, p. 18.
4) H. Kotani, M. Matsumura, A. Fujii, H. Genjou, and Nagano, "Low-Temperature APCVD Oxide Using TEOS-Ozone Chemistry for Multilevel Interconnections," Tech. Dig. International Electron Devices Meeting (1989) p. 669.
5) Y. Nishimoto, and K. Maeda, "Reduction in Hygroscopic of TEOS-$O_3$ CVD Film After Plasma Process", Semiconductor World February Issue (1993), p.82.
6) Y. Hosoda, H. Harada, A. Shimizu, K. Watanabe, and H. Ashida, "Low Temperature Anneal Effect On Hygroscopic of TEOS-$O_3$ APCVD NSG Film" Semiconductor World, February Issue (1993), p. 77.

It can be taken that, when P-TEOS layer 21 is exposed to a $N_2$-gas plasma, it (i.e., P-TEOS layer 21) takes either one of two types of surface forms described below.

FIG. 13 illustrates one of the two surface forms, and the FIG. 14 shows the other surface form. In the former surface form, "Si—O—Si" bonds or "Si—OH" bonds are broken upon exposure to a $N_2$-gas plasma, and the number of dangling bonds, shown in the figure in the form of "Si—" or "Si—O—", increases. In the latter surface form, silicon joins to nitrogen to produce "Si—N—Si" bonds, and the number of dangling bonds decreases.

In both the above-described cases, when a $N_2$-gas plasm process is performed, N ions or electrons "fly" to the surface of P-TEOS layer 21, with taking an arriving angle, $\theta_1$, with respect to the project part and an arriving angel, $\theta_2$ with respect to the recess part (see FIGS. 13 and 14). Due to the difference between the arriving angle $\theta_1$ and the arriving angle $\theta_2$, the project part and the recess part receive different amounts of ions or electrons. As seen from FIGS. 13 and 14, the arriving angle $\theta_1$, is about 180 degrees, whereas the arriving angle $\theta_2$ is small. Additionally, the value of the arriving angle $\theta_2$ varies with the recess part pattern. The $N_2$-gas plasma process is dependent on the form of an underlying layer (i.e., first metallization layer 16), and it is difficult to control the surface state of P-TEOS layer 21.

The $N_2$-gas plasma process presents the problem in that P-TEOS layer 21 is formed into a stepped profile depending on the presence or absence of first metallization layer 16, and the effect of the $N_2$-gas plasma process differs depending on the stepped profile of P-TEOS layer 21.

Further, the $N_2$-gas plasma process always requires P-TEOS layer 21 as an underlying layer and an apparatus for performing a $N_2$-gas plasma process, which complicates not only processing requirements but also processing steps.

SUMMARY OF THE INVENTION

Bearing in mind the above-described problems, the present invention was made. It is therefore an object of the present invention to provide a technique capable of providing a favorable underlying topography for an overlying layer (e.g., a TEOS-$O_3$ layer deposited by means of an APCVD process making use of the chemical reaction of TEOS with ozone).

The present invention was made by paying attention to the dependency of the TEOS-$O_3$ layer on the underlying topography. That is, if the underlying layer and the TEOS-$O_3$ layer are formed by different materials, this causes the film thickness of the TEOS-$O_3$ layer to vary, and if the underlaying layer has a hydrophilic and a hydrophobic region, this produces differences in the film deposition rate as well as in the deposition delay time. In accordance with the present invention, however, a molecular layer, composed of molecules containing hydrophobic groups, is formed on the underlying layer prior to the formation of the TEOS-$O_3$ layer. Alternatively, a molecular layer may be formed by means of vapor-to-solid interface reaction by solution application or by a vapor spray.

The present invention discloses a semiconductor device comprising:

(a) a semiconductor substrate;

(b) a first metallization layer locally formed on a surface of the semiconductor substrate thereby leaving portions of the surface of the semiconductor substrate exposed;

(c) a first silicon oxide layer formed in such a manner that the first silicon oxide layer covers the exposed portions of the semiconductor substrate's surface and the first metallization layer;

(d) a molecular layer formed on the first silicon oxide layer, the molecular layer being made up of molecules containing hydrophobic groups;

(e) a second silicon oxide formed on the molecular layer by means of a chemical vapor deposition (CVD) process making use of the chemical reaction between ozone and organo-silicon; and (f) a second metallization layer locally formed on the second silicon oxide layer.

The present invention discloses a first semiconductor device fabrication method comprising the steps of:

(a) locally forming a first metallization layer on a surface of a semiconductor substrate leaving portions of the surface of the semiconductor substrate exposed;

(b) forming a first silicon oxide layer in such a manner that the first silicon oxide layer covers the exposed portions of the semiconductor substrate's surface and the first metallization layer;

(c) forming a molecular layer on the first silicon oxide layer, the molecular layer being made up of molecules containing hydrophobic groups;

(d) depositing a second silicon oxide on the molecular layer by means of a chemical vapor deposition (CVD) process making use of the chemical reaction between ozone and organo-silicon; and (e) locally forming a second metallization layer on the second silicon oxide layer.

In accordance with the present invention, the above-described second silicon oxide layer, produced by a CVD process making use of the chemical reaction of ozone with organo-silicon, has good film properties and a uniformity of film thickness. In the usual multilevel interconnection metallization structure, a lower-level metallization layer and its neighboring areas are most likely to be placed in the oxidization state. Such an oxidized surface, when water-washed or exposed to moisture in air, is affected by water, so that the surface will be covered with hydroxyl groups taking such forms as "Si—OH", "B—OH", "P—OH", and "Ti—OH". If a molecular layer, made up of molecules containing hydrophobic groups such as hexamethyldisilazane (HMDS, $[Si(CH_3)_3]_2NH$), is formed on that oxidized layer surface, this causes the surface to be silylated and the surface is covered with, for example, trimethylsilyl groups. Some silylation reactions are shown below.

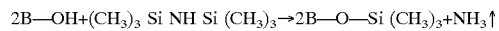
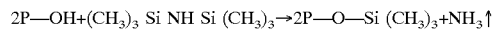
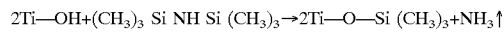

Note: ↑=volatility

As a result of performing a silylation process, the entire surface of an underlying layer is covered with methyl groups and becomes hydrophobic, and the underlying layer's surface becomes uniform in film thickness and comes to have good film properties, without carrying out a $N_2$-gas plasma process.

In accordance with the present invention, the molecular layer made up of molecules containing hydrophobic groups is formed on the first silicon oxide layer, so that the second silicon oxide layer, formed by a CVD process utilizing the reaction of ozone with organo-silicon, has a hydrophobic surface. Accordingly, without the help of a $N_2$-gas plasma process, the underlying layer's surface becomes equally hydrophobic and comes to have good film properties. Therefore, with the present invention, the dependence on the underlying topography in the CVD method utilizing the chemical reaction of ozone with organo-silicon is cancelled, and a favorable second silicon oxide layer can be produced.

Preferably, the molecular layer is made up of a surface-active agent, and such a surface-active agent contains therein silicon or germanium. This ensures the formation of a molecular layer, composed of molecules containing hydrophobic groups, on the first silicon oxide layer.

The present invention discloses a second semiconductor device fabrication method comprising the steps of:

(a) locally forming a first metallization layer on a surface of a semiconductor substrate thereby leaving portions of the surface of the semiconductor substrate exposed;

(b) forming a first silicon oxide layer in such a manner that the first silicon oxide layer covers the exposed portions of the semiconductor substrate's surface and the first metallization layer;

(c) forming a molecular layer on the first silicon oxide layer by means of a vapor-to-solid interface reaction process by a solution application or by a vapor spray;

(d) depositing a second silicon oxide on the molecular layer by means of a chemical vapor deposition (CVD) process making use of the chemical reaction between ozone and organo-silicon; and (e) locally forming a second metallization layer on the second silicon oxide layer.

In accordance with the above-described second semiconductor device fabrication method, the second silicon oxide layer becomes uniform in film property without a $N_2$-gas plasma process, because the molecular layer is provided on the first silicon oxide layer as well as on part of the semiconductor substrate surface. Accordingly, without the help of a $N_2$-gas plasma process, it is possible to uniform the underlying layer's surface. Therefore, with the present invention, the dependence on the underlying topography in the CVD method utilizing the chemical reaction of ozone with organo-silicon is cancelled, and a favorable silicon oxide layer can be produced.

DETAILED DESCRIPTION OF THE INVENTION

Figure 1A:
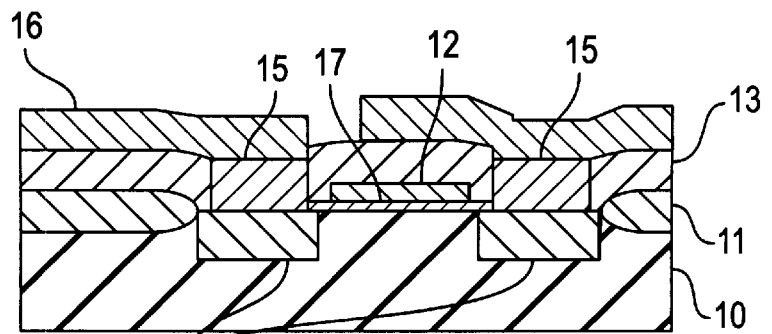
FIGS. 1a–d illustrate in cross section subsequent steps of the fabrication of a semiconductor device according to a first embodiment of the present invention.

Preferred embodiments of the present invention are described below with reference to the accompanying drawings.

FIGS. 1a–d illustrate in cross section subsequent steps of the fabrication of a semiconductor device according to a first embodiment of the present invention.

Formed on silicon semiconductor substrate 10 are source (or drain) region 14, gate insulating layer 17, LOCOS layer 11, gate electrode 12 of polysilicon, BPSG layer 13, source (or drain) electrode 15 made of tungsten, and first metallization layer 16.

Figure 1B:
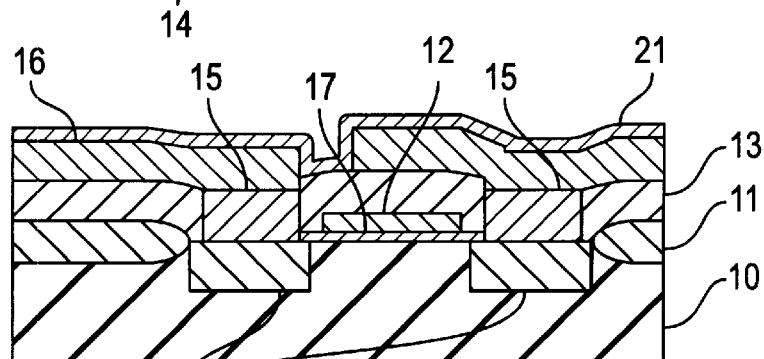
Figure 1C:
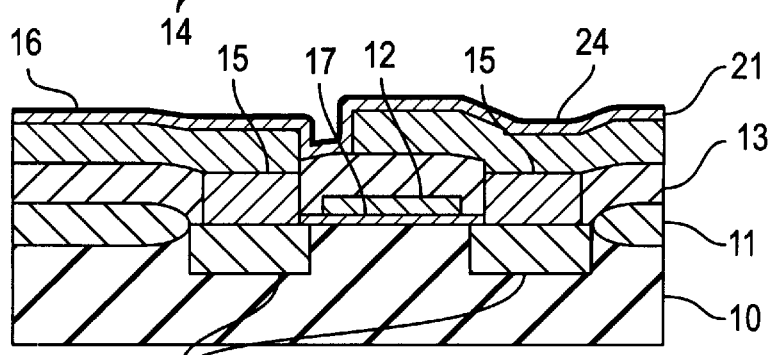

P-TEOS layer 21 (i.e., a first silicon oxide) is deposited on BPSG layer 13 as well as on first metallization layer 16 by means of a plasma CVD from a source gas of TEOS (see FIG. 1b).

Hexamethyldisilazane, abbreviated HMDS, is supplied to form molecular layer 24 on P-TEOS layer 21 (reaction temperature: 130° C.; HMDS flow rate: 5 sccm; pressure: 1 atm; and reaction time: 5 minutes) (see FIG. 1c).

Figure 1D:
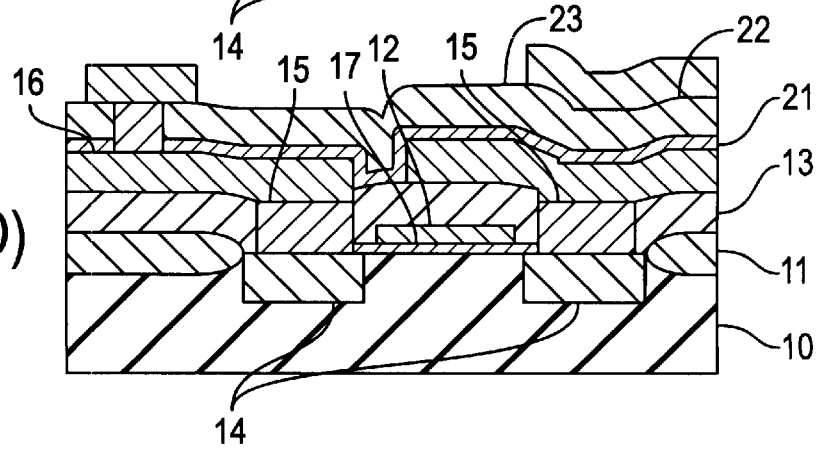
Figure 2:
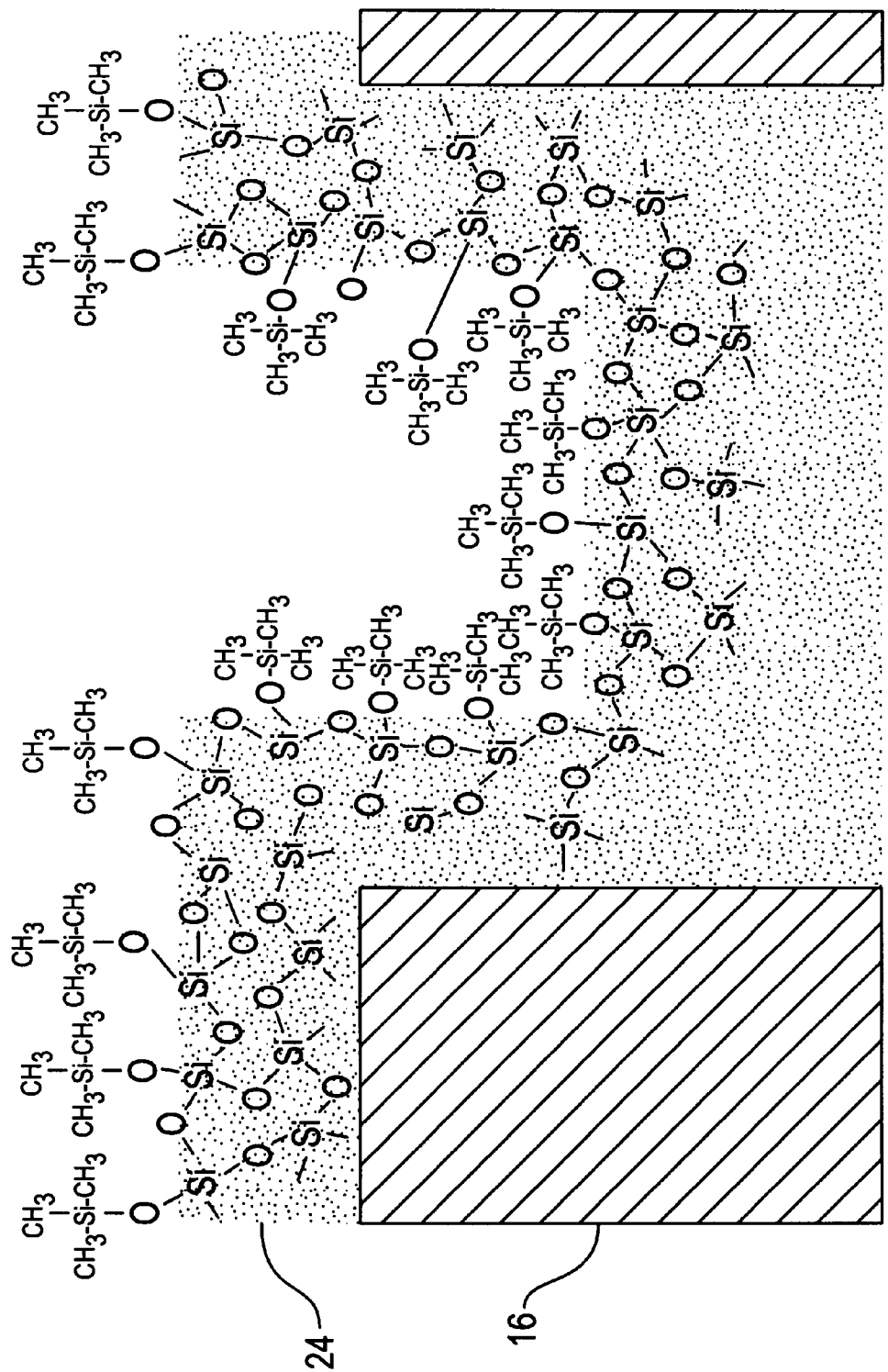
FIG. 2 is a diagram cross-sectionally illustrating the structure of a molecular layer formed on a first metallization layer according to a method of the first embodiment.

Next, TEOS-$O_3$ layer 22 (i.e., a second silicon oxide) is deposited on molecular layer 24 by means of an APCVD process making use of the reaction of TEOS with $O_3$, and second metallization layer 23 is formed on TEOS-$O_3$ layer 22 (see FIG. 1d).

First metallization layer 16 may be formed by such materials as silicon materials (e.g., crystal silicon and polycrystal silicon), silicon dioxide compounds (e.g., BPSG), and metallic materials (e.g., aluminum alloys, titanium compounds, tungsten compounds). Silicon material is readily oxidized, so a native oxide is created on the surface, and even TiN metal, which is very unlikely to be oxidized, becomes nonstoicheiometric and suffers from a Ti oxide on the surface layer. Therefore, it can be taken that first metallization layer's 16 surface is covered with "—OH" groups, and if HMDS is supplied onto the surface of first metallization layer 16, the HMDS thus supplied reacts with the "—OH" groups to form a water-hating or hydrophobic molecular layer.

One method of producing hydrophobic molecular layer is a silylation process. In the silylation reaction, a silylation compound such as HMDS reacts with "—OH" groups thereby replacing "H's" of the "—OH" groups with silyl groups to take a form of "—O—Si(CH$_3$)$_3$". Silylation reaction occurs at room temperature so that a silylation process can be carried out easily.

After the silylation process, every existing dangling bond is covered with "Si—(CH$_3$)$_3$". This can prevent the dangling bond from exerting ill-effect on the deposition of TEOS-$O_3$ layer 22. The following are typical silylation techniques.

Figure 3A:
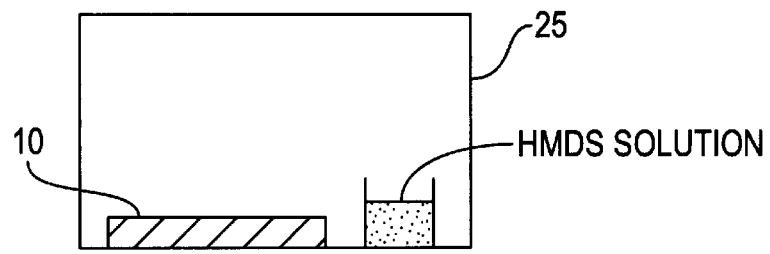
FIGS. 3a–c illustrate steps of the formation of a molecular layer in the first embodiment.
Figure 3B:
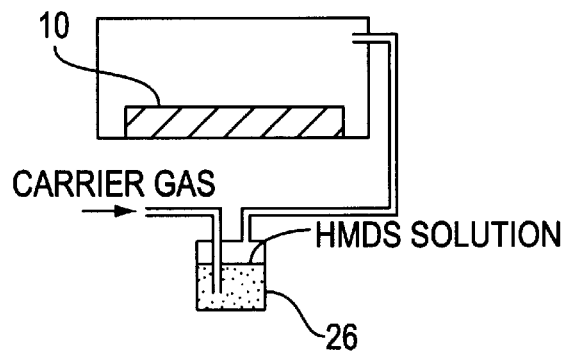
Figure 3C:
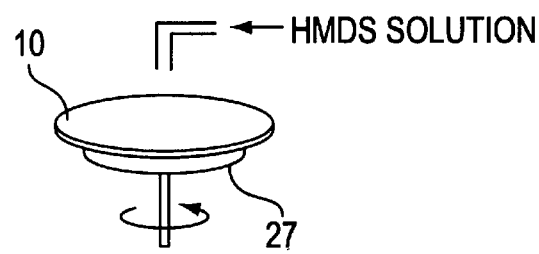

HMDS vapor coating:
  (a) exposure to vapors within the oven
  (b) exposure to bubbling vapors HMDS spin coating:
  (c) solution spin coating FIGS. 3a–c respectively show these three techniques. As shown in FIG. 3a, desiccator 25 is filled with HMDS vapors resulting from heating a HMDS solution, and the HMDS vapors stick to first metallization layer 16 on semiconductor substrate 10. As shown in FIG. 3c, a HMDS solution is bubbled by means of HMDS bubbler 26 using a carrier gas such as $N_2$ gas to produce HMDS vapors, and the HMDS vapors stick to first metallization layer 16. As shown in FIG. 3c, a HMDS solution is supplied onto the surface of first metallization layer 16 on semiconductor substrate that is being rotated by spinner 27, whereby first metallization layer 16 is coated with the HMDS solution.

The evaluation of a case is described in which molecular layer 24 composed of HMDS is formed on top of first metallization layer 16 and TEOS-$O_3$ layer 22 is formed on molecular layer 24.

Figure 4:
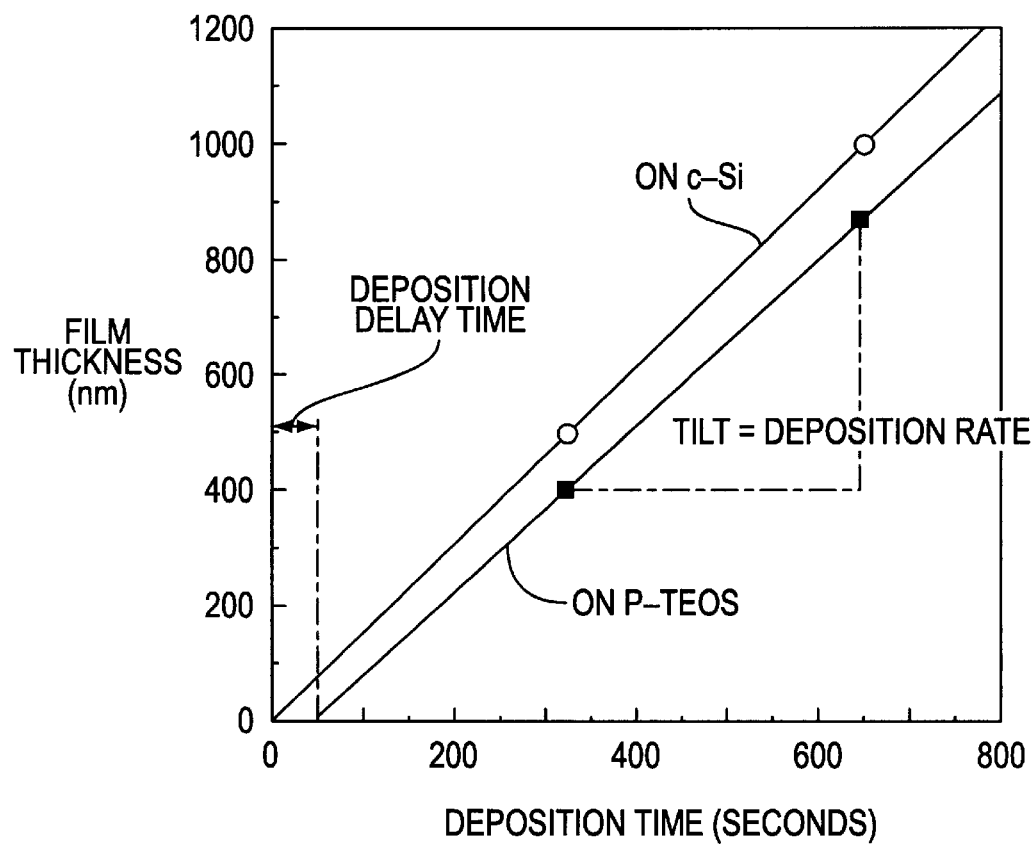
FIG. 4 is a graph showing a way of obtaining the deposition rate and the deposition delay time to observe the dependence of the overlying layer on the underlying topography.

Firstly, how TEOS-$O_3$ layer 22 depends on the underlying topography is explained. FIG. 4 is a graph showing a way of obtaining the deposition rate and the deposition delay time to observe the dependence of TEOS-$O_3$ layer 22 on the underlying topography. FIG. 4 also shows the relationship of the deposited film thickness versus the deposition time, in the cases of the TEOS-$O_3$-on-crystal silicon deposition and the TEOS-$O_3$-on-P-TEOS deposition. The deposition delay time is the value obtained at a measurement point where extrapolation line shows that a deposited film thickness is zero, and the deposition rate is found from the extrapolation line's tilt angle.

Figure 5:
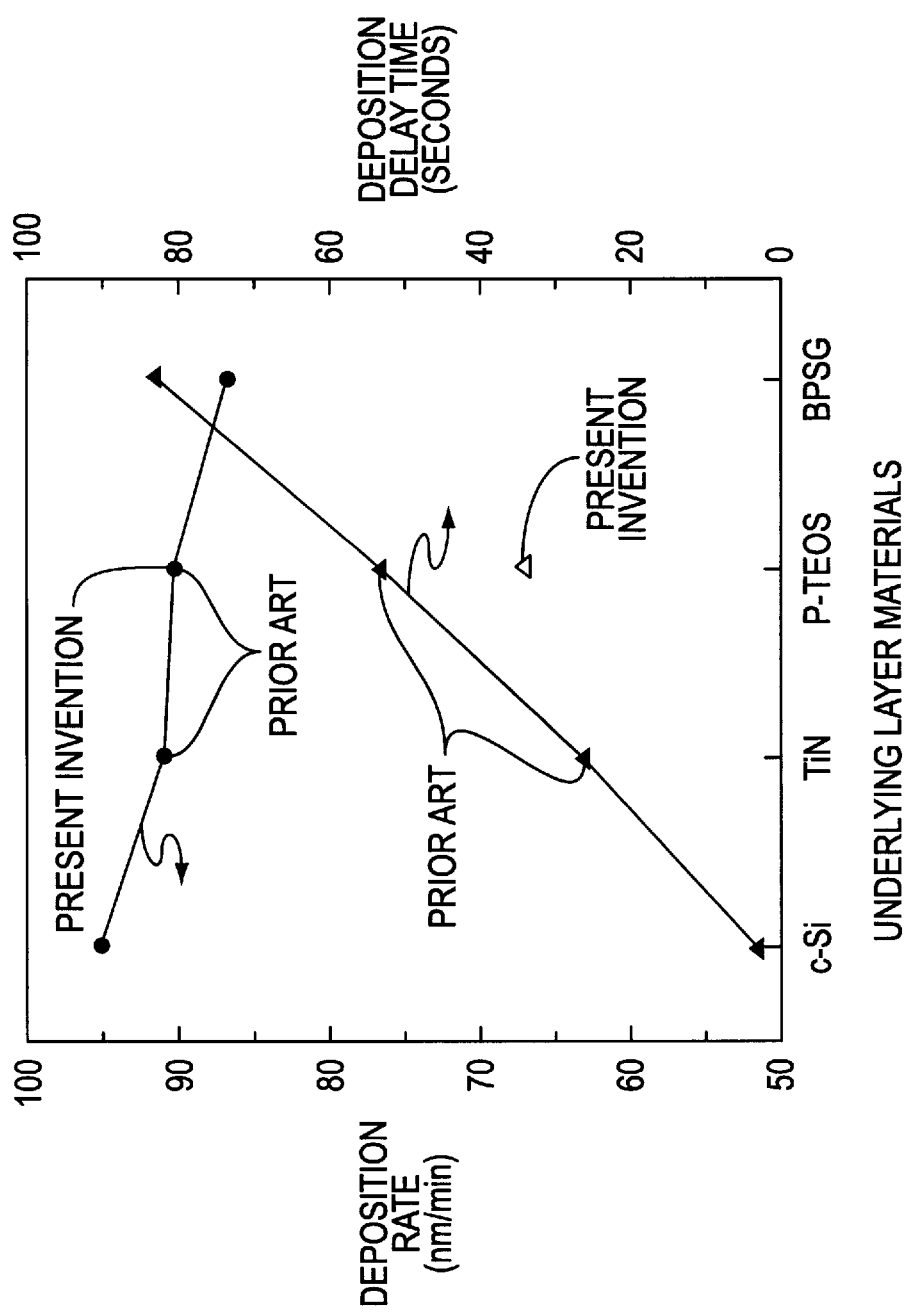
FIG. 5 is a graph showing the relationships of the underlaying layer material versus the deposition rate and the deposition delay time.

FIG. 5 shows the relationship of the underlying layer material versus the deposition rate/deposition delay time. Such samples as crystal silicon, P-TEOS, post-glass flow BPSG, and TiN were used, and each of the first three samples was kept in the clean room for three days from the sample preparation until the deposition of TEOS-$O_3$ layer 22 on each sample. The TiN sample was likewise kept, but for 21 days. This examination showed that the crystal silicon proved to provide the fastest deposition rate, with the TiN, the P-TEOS, and the BPSG, in that order, and that the BPSG proved to produce the greatest deposition delay time, with the P-TEOS, the TiN, and the crystal silicon, in that order.

Figure 6:
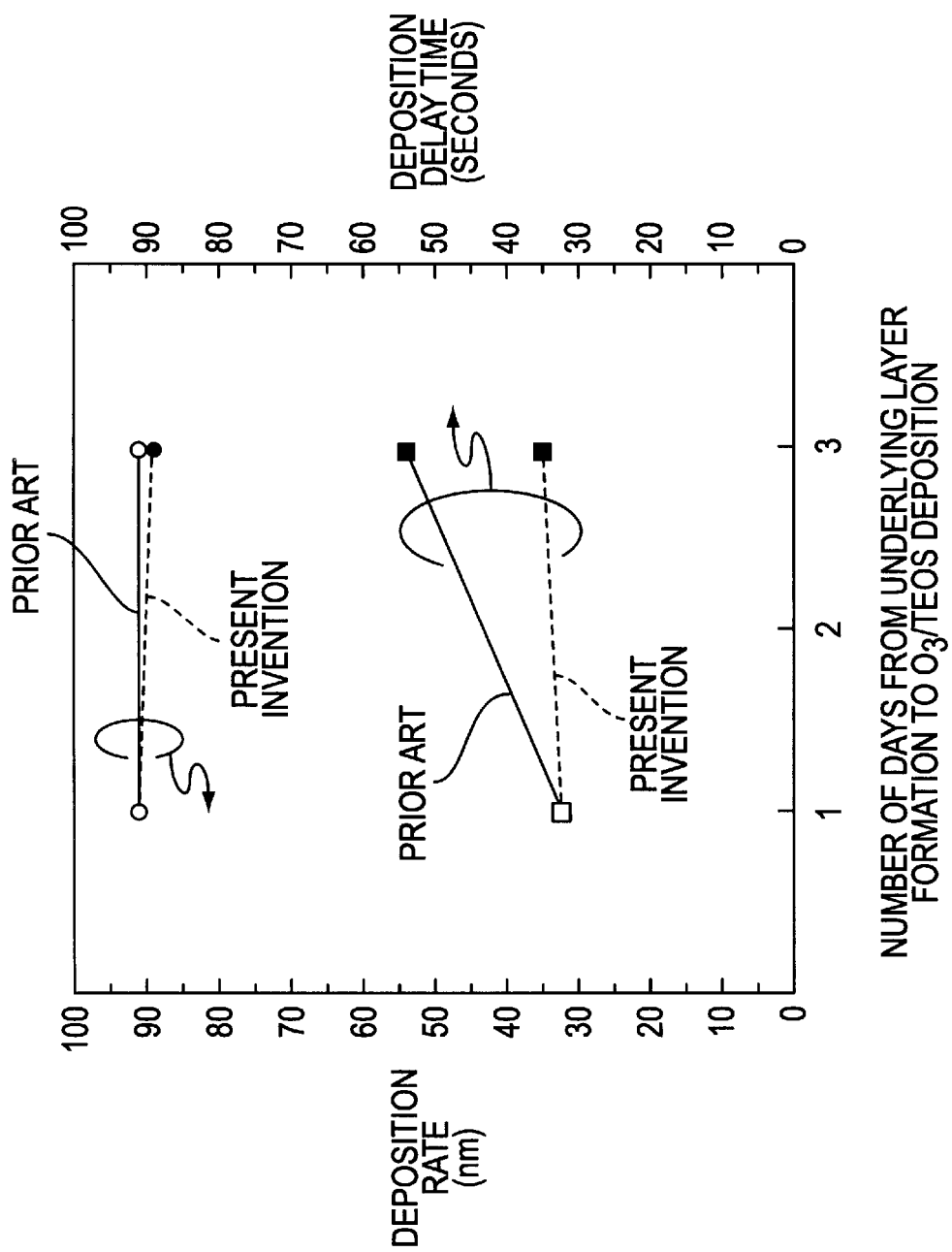
FIG. 6 is a graph showing the relationships of the elapsed time from the formation of a P-TEOS layer or molecular layer until the formation of a TEOS-$O_3$ layer versus the deposition rate/deposition delay time.

The cause of the above results was investigated by changing the length of time taken from the formation of P-TEOS layer 21 until the deposition of TEOS-$O_3$ layer 22 on P-TEOS layer 21, to a period of one day and to a period of three days. Additionally, to evaluate the present invention, another testing was carried out by changing the length of time taken from the formation of molecular layer 24 on P-TEOS layer 21 until the deposition of TEOS-$O_3$ layer 22 on molecular layer 24, to a period of one day and to a period of three days. FIG. 6 shows the results. As seen from FIG. 6, the deposition rate did not vary with time in both of the conventional technique case and the present invention case, but, as to the deposition delay time, there were found differences between them. For the case of the conventional technique, the deposition delay time increased with time, whereas, for the case of the present invention technique taking advantage of molecular layer 24, the deposition delay time stayed unchanged.

Even if the same material is used to form an underlying layer, this does not contribute to preventing the deposition delay time from varying, but the formation of molecular layer 24 on P-TEOS layer 21 does.

If an underlying layer (i.e., P-TEOS layer 21) is covered with molecular layer 24 in prior to forming TEOS-$O_3$ layer 22, the surface of the underlaying layer becomes uniform and hydrophobic. This allows the APCVD method utilizing the chemical reaction of TEOS with $O_3$ to deposit TEOS-$O_3$ layer 22 having good film properties.

The relationship of a uniform hydrophobic underlying layer surface versus TEOS-$O_3$ layer 22 is considered below.

Figure 7:
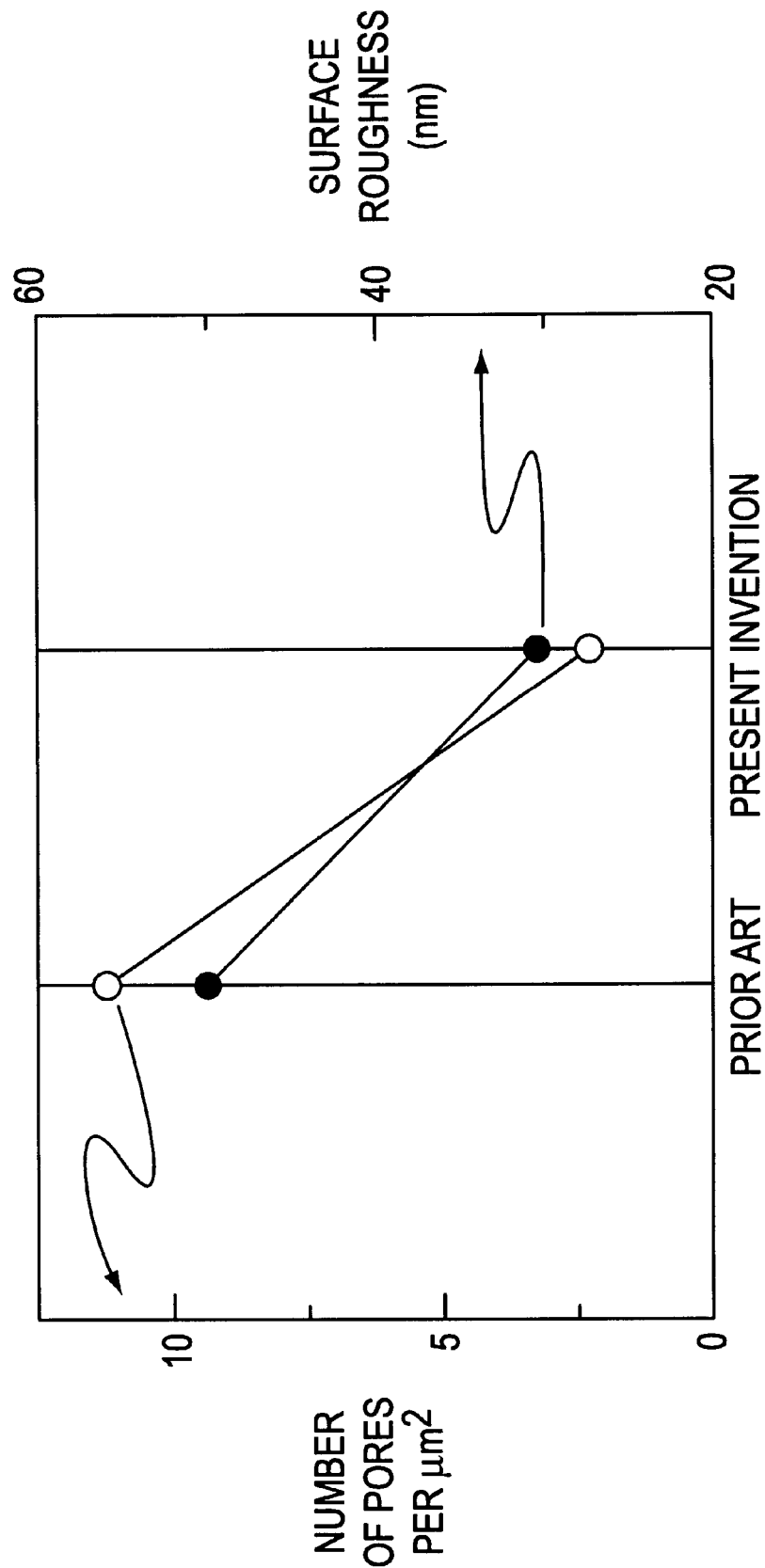
FIG. 7 is a graph showing differences in the surface roughness and in the number of pores between a conventionally formed TEOS-$O_3$ layer and a TEOS-$O_3$ layer of the first embodiment.

In the first place, the relationship of the hydrophobic underlying layer surface versus TEOS-$O_3$ layer 22 is illustrated by making reference to FIG. 7. TEOS-$O_3$ layer 22 was formed and was forced to fracture. Then, the surface and inside of TEOS-$O_3$ layer 22 was slightly etched using a water solution of hydrofluoric acid, and the surface roughness and the number of pores (i.e., the number of recesses) caused by the strength and weakness of etching were examined. Because of the existence of molecular layer 24 overlying P-TEOS layer 21, the surface of TEOS-$O_3$ layer 22 of the present invention suffers less severe surface roughness and a less number of pores, compared with the conventional technique.

Figure 8:
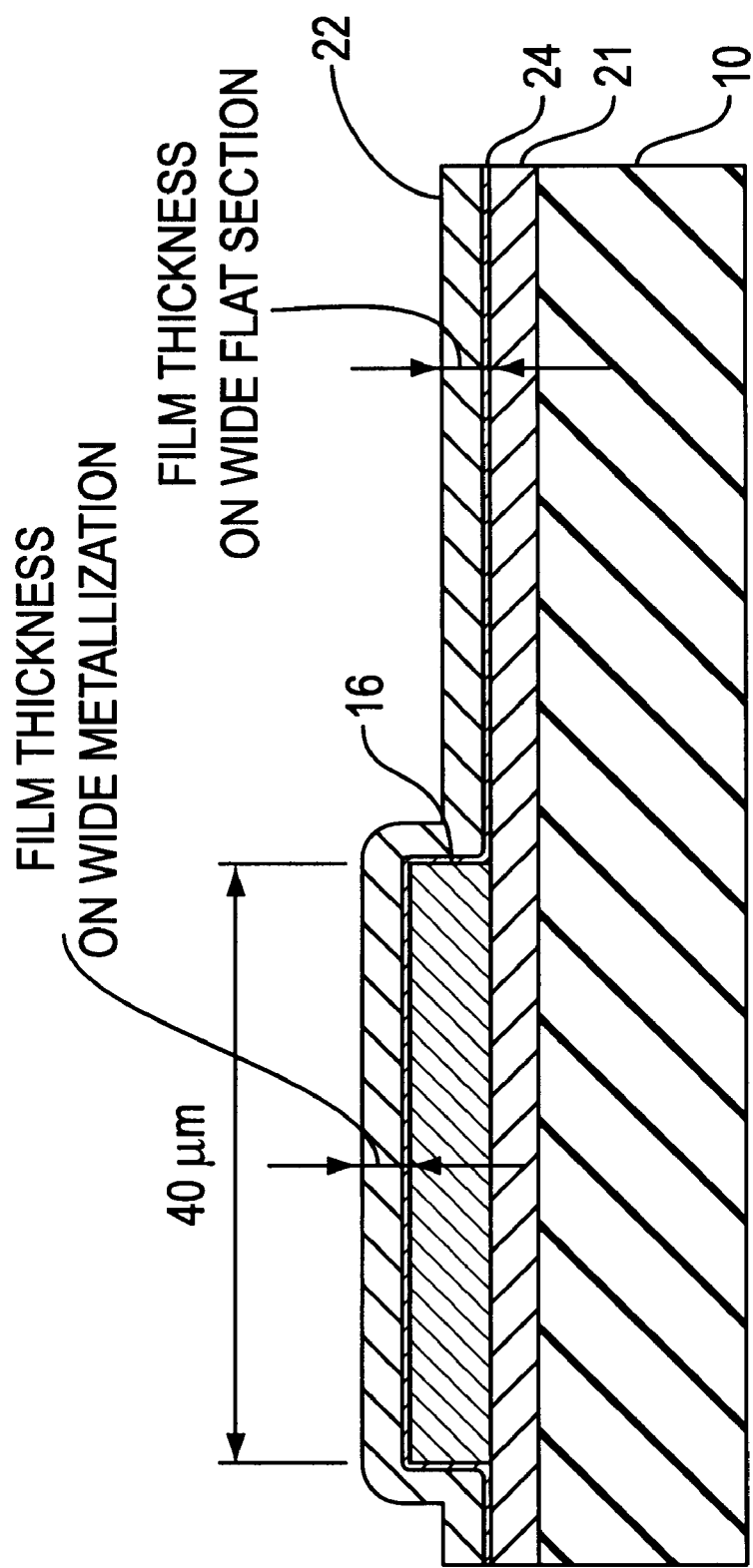
FIG. 8 is a cross-sectional view in respect to the evaluation of both a conventionally formed TEOS-$O_3$ layer and a TEOS-$O_3$ layer of the first embodiment.

Next, the relationship of a uniform underlying layer surface versus TEOS-$O_3$ layer 22 is described. A semiconductor device was cut after TEOS-$O_3$ layer 22 had been formed, and the cross section thereof was observed using a scanning electron microscope (SEM). More specifically, as shown in FIG. 8, the film thickness of TEOS-$O_3$ layer 22 was measured at different locations, namely at a point overlying a metallization having a great width of 40 $\mu$m and at a point overlying a wide flat section with no metallizations provided, in order to find the ratio of the film thickness measured at the former point to the film thickness measured at the latter point. The present invention provided a ratio value of 0.99 versus 0.70 for the conventional technique. In other words, the prior art technique produces the problem in that the film thickness of TEOS-$O_3$ layer 22 formed on a wide interconnection metallization is thinner than on a wide flat section containing no metallizations. The present invention provides a solution to such a problem.

The above-described mechanism accompanied by the conventional technique may be explained as follows. A first assumption is that P-TEOS layer 21 is raised locally by first metallization layer 16, whereby the raised portion is exposed intensively to charges or particles from a plasma thereby causing the deterioration of P-TEOS layer 21 to occur. A second assumption is that part of P-TEOS layer 21 overlying first metallization layer 16 is very much influenced by thermal expansion of first metallization layer 16 thereby causing the deterioration of P-TEOS layer 21 to occur.

Figure 11A:
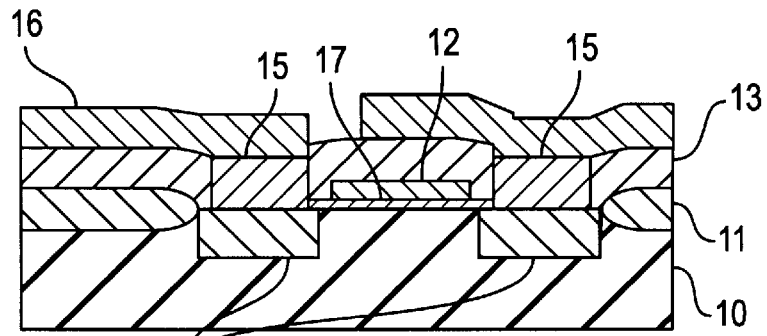
FIGS. 11a–c illustrate in cross section subsequent steps of the fabrication of a semiconductor device according to a conventional fabrication method.
Figure 11B:
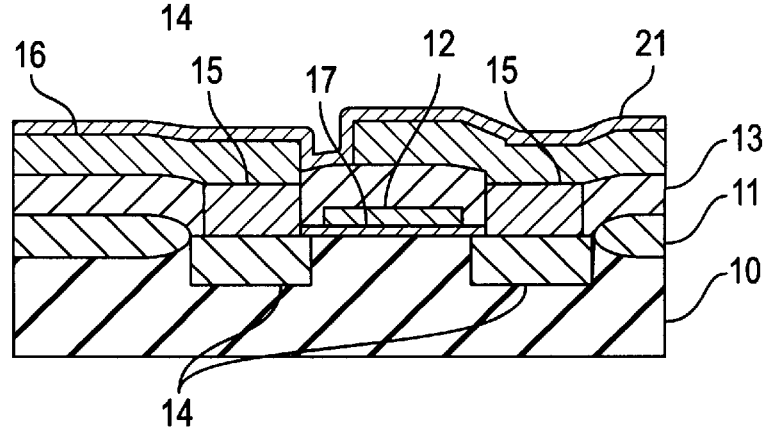
Figure 11C:
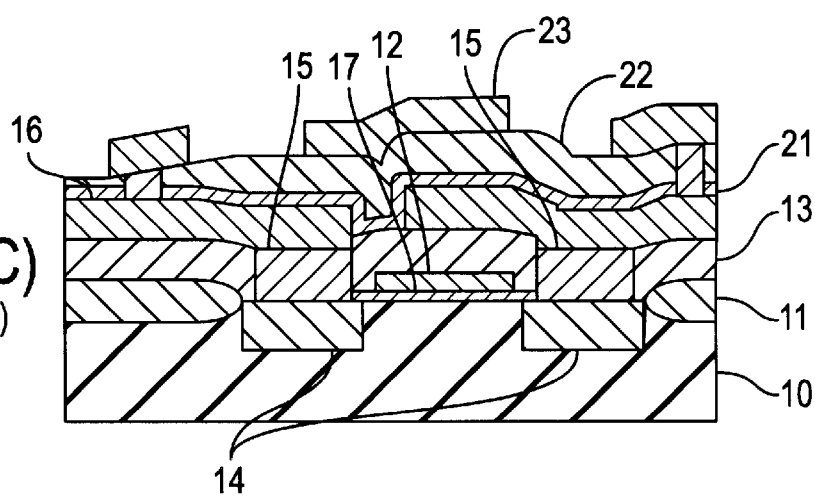
Figure 12:
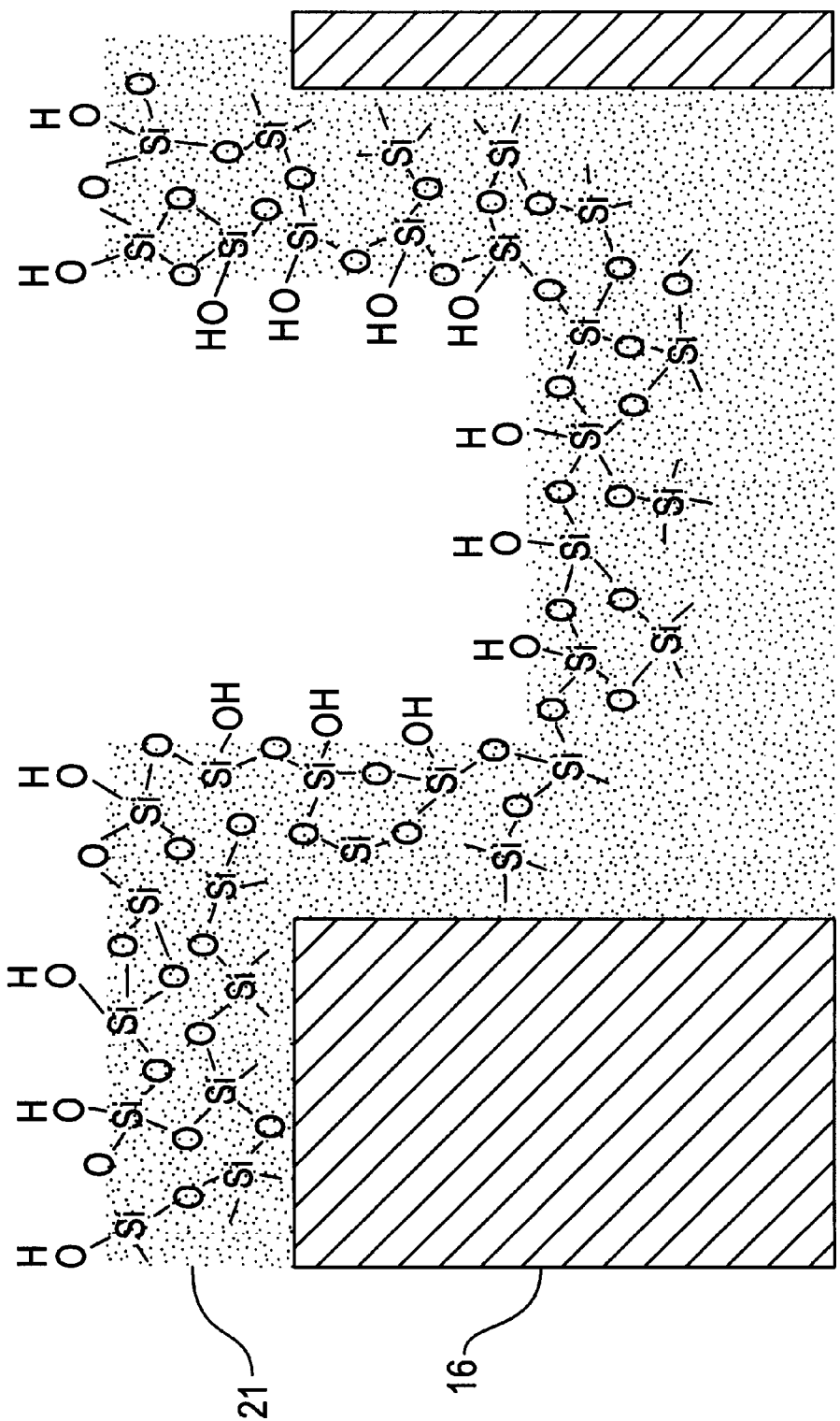
FIG. 12 is a diagram cross-sectionally illustrating the structure of a P-TEOS layer formed on a first metallization layer by means of a conventional method.
Figure 13:
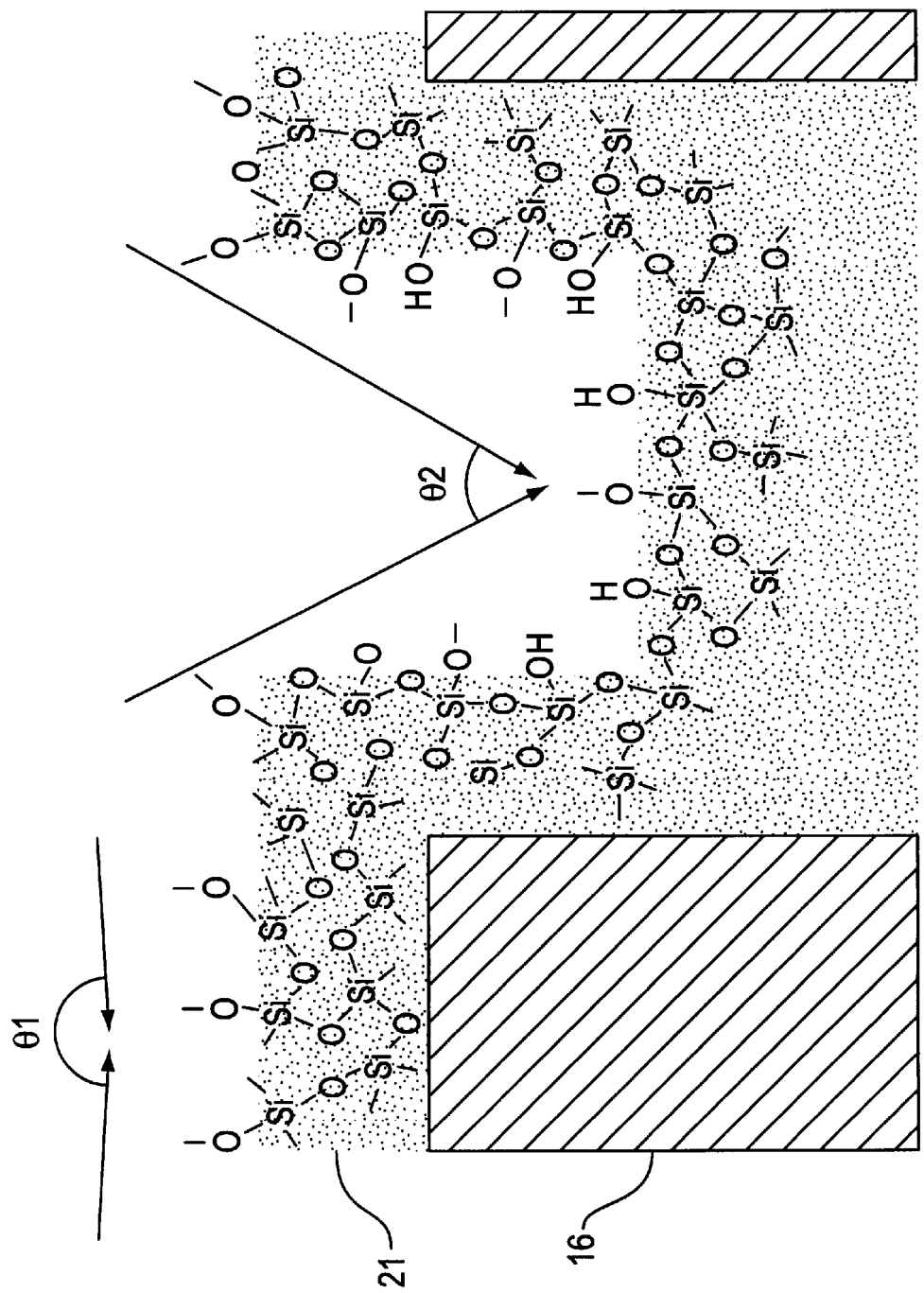
FIG. 13 is a diagram cross-sectionally illustrating the structure of a conventionally formed P-TEOS layer when exposed to a $N_2$-gas plasma.
Figure 14:
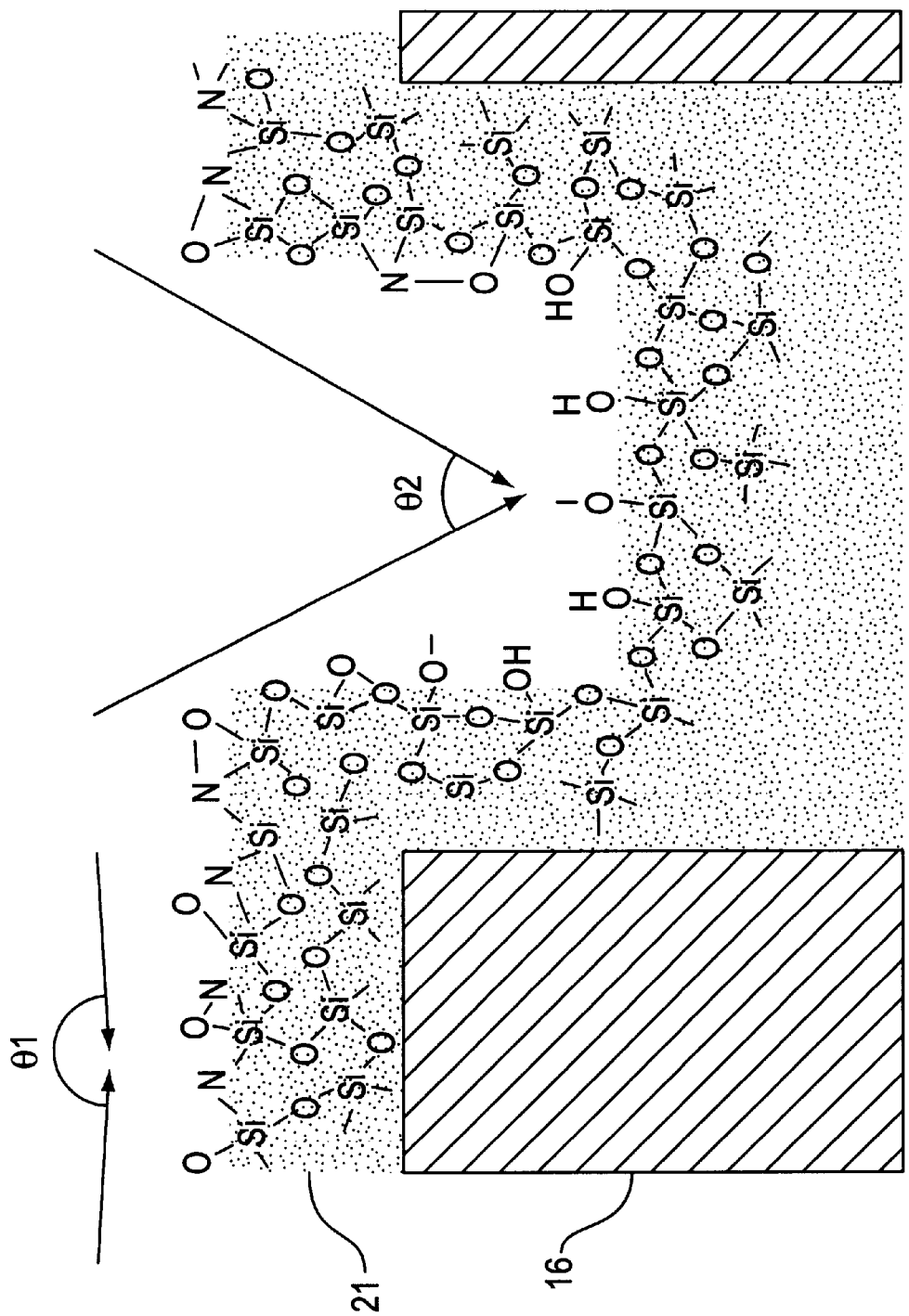
FIG. 14 is another diagram cross-sectionally illustrating the structure of a conventionally formed P-TEOS layer when exposed to a $N_2$-gas plasma.

Although a technique of exposing P-TEOS layer 21 to a $N_2$-gas plasma has an advantage to prevent the film thickness of P-TEOS layer 21 from becoming thinner at a specific point overlying a wide metallization, it still suffers from some drawbacks. If the film thickness of gate insulating layer 17 becomes below 10 nm when the scale of integration becomes larger, first metallization layer 16 is affected when P-TEOS layer 21 is exposed to a plasm, even though it is covered with P-TEOS layer 21 (see FIG. 11b). As a result, ions or electrons flow from the plasma into first metallization layer 16 associated with gate electrode 12 thereby creating an electric field between gate electrode 12 and semiconductor substrate 10 and destroying gate insulating layer 17. Therefore, the above-described $N_2$-gas plasma technique has limitations to device miniaturization. Conversely, the present invention does not rely on any plasma-aided process, so there are no device miniaturization limitations.

Referring now to FIGS. 9a–d, a semiconductor device and associated fabrication method of a second embodiment of the present invention are described.

Figure 9A:
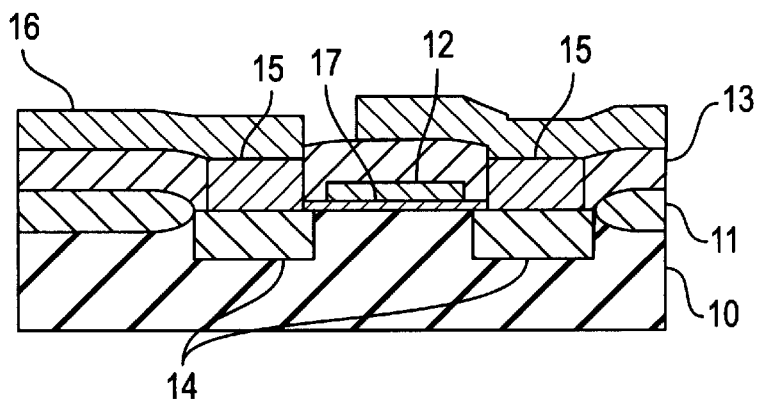
FIGS. 9a–c illustrate in cross section subsequent steps of the fabrication of a semiconductor device according to a second embodiment of the present invention.

Formed on semiconductor substrate 10 are source (or drain) region 14, gate insulating layer 17, LOCOS layer 11, polysilicon gate electrode 12, BPSG layer 13, tungsten source (or drain) region 15, and first metallization layer 16 (see FIG. 9a).

Figure 9B:
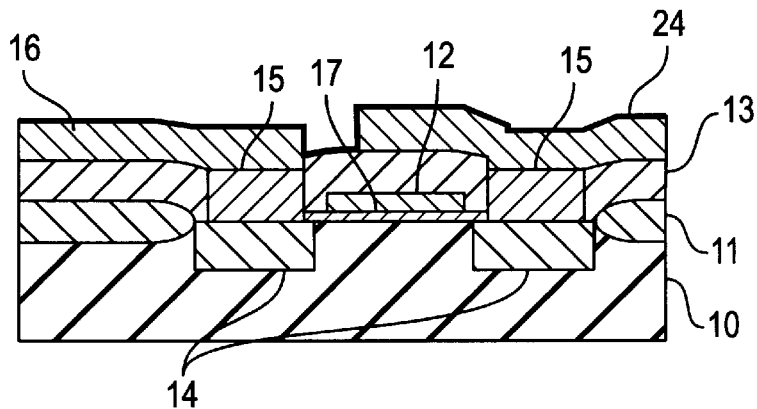
Figure 9C:
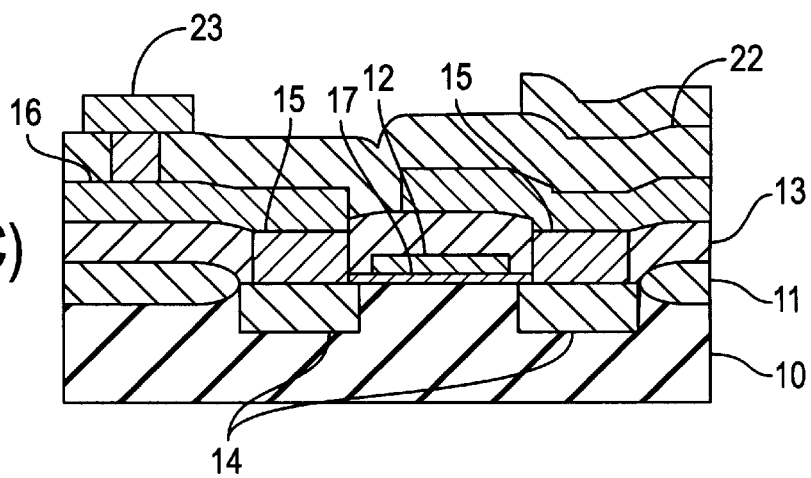

Next, semiconductor substrate 10 is drip-fed an HMDS solution and is spin-coated with HMDS, and, as shown in FIG. 9b, HMDS molecular layer 24 is formed on first metallization layer 16.

Then, an APCVD process utilizing the TEOS-to-$O_3$ chemical reaction is carried out to deposit TEOS-$O_3$ layer 22 on molecular layer 24. This is followed by the formation of second metallization layer 23 on TEOS-$O_3$ layer 22 (see FIG. 9c).

TEOS-$O_3$ layer 22 was deposited on first metallization layer 16 without forming P-TEOS layer 21 but with an intervening molecular layer, in order to investigate the effect of silylation on the deposition of TEOS-$O_3$ layer 22.

Figure 10:
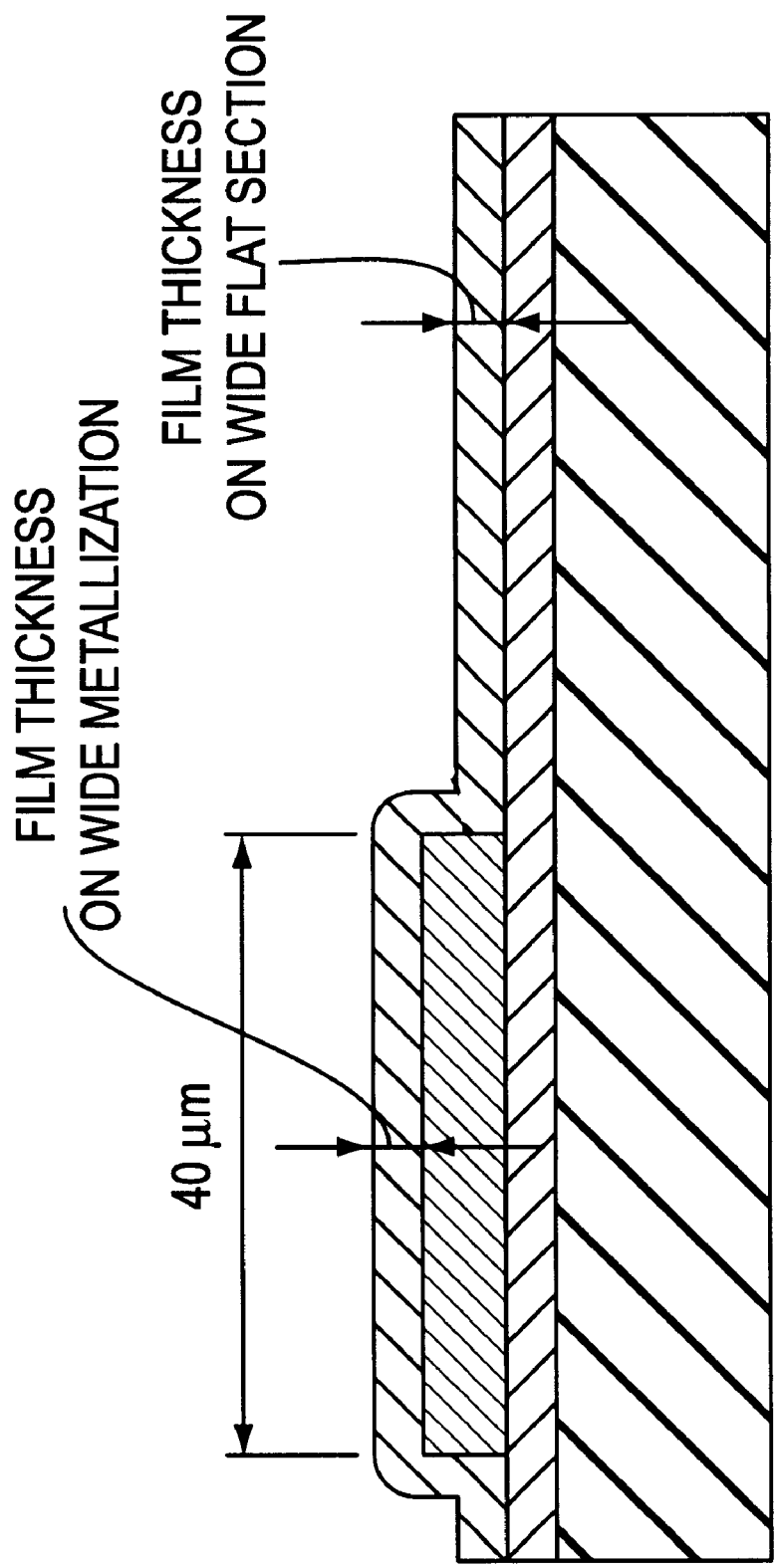
FIG. 10 is a cross-sectional view in respect to the evaluation of both a conventionally formed TEOS-$O_3$ layer and a TEOS-$O_3$ layer of the second embodiment.

The profile of TEOS-$O_3$ layer 22 thus formed was examined using an SEM in order to measure the film thickness of TEOS-$O_3$ layer 22 at two locations, namely at a point overlying a 40 μm-wide metallization and at a point overlying a wide flat section with no metallizations provided. The ratio of the film thickness measured at the former point to that measured at the latter point was found. The present invention provided a ratio value of 0.96 versus 0.40 for the conventional technique. There were observed outstanding differences in the film thickness of TEOS-$O_3$ layer 22 overlying a wide metallization. In the conventional technique, TEOS-$O_3$ layer 22 decreases in film thickness in the vicinity of the center of the wide metallization layer down to about 40% of the film thickness of TEOS-$O_3$ layer 22 overlying the flat section (see FIG. 10). The film thickness of TEOS-$O_3$ layer 22 varies depending on the metallization pattern, resulting in causing capacitance variations between metallizations and causing throughhole depth variations. Conversely, the present invention is able to provide conformal deposition because of the above-mentioned ratio value.

In the first and second embodiments, TEOS-$O_3$ layer 22 is deposited by means of APCVD. However, other deposition techniques such as simply depositing TEOS-$O_3$ layer 22 in a reduced pressure state may be used with the same effect. Additionally, the plasma CVD method to generate ozone by exposing oxygen to a plasma or UV light, or the photo CVD may be employed.

Further, in the first and second embodiments, aluminum alloy is used as metallization material. However, other functionally equivalent metallization materials such as pure aluminum and capper may be used with the same effect.

Furthermore, in the first and second embodiments, HMDS is used to form molecular layer 24. However, instead of using HMDS, other surface-active agents, including silane compounds, siloxane compounds, disilazane compounds, trisilazane compounds, piperazine compounds, aminogermanium compounds, halide germanium compounds, may be used.

Further, in the first and second embodiments, TEOS is used to form P-TEOS layer 21 and TEOS-$O_3$ layer 22. However, other functionally equivalent organo-silicon compounds, including tetramethoxysilane, tetrapropoxysilane, hexamethyldisiloxane, tetramethylsilane, and tetraethylsilane, may be used.

To sum up, with the present invention, the underlying layer surface topography is made uniform by the molecular layer. This eliminates the need for forming silicon oxides thereby further eliminating the need for the $N_2$-gas plasma process. In other words, the number of semiconductor device fabrication steps can be reduced. Especially, the gate insulating layer becomes free from any damage due to the $N_2$-gas plasma process, and there are no constraints to the device miniaturization required by the larger-scale integration.

The invention claimed is:

1. A semiconductor device fabrication method comprising the steps of:
    (a) locally forming a first metallization layer on a surface of a semiconductor substrate thereby leaving portions of said surface of said semiconductor substrate exposed;
    (b) forming a first silicon oxide layer by means of a chemical vapor deposition process in such a manner that said first silicon oxide layer covers said exposed portions of said semiconductor substrate's surface and said first metallization layer;
    (c) forming a molecular layer on said first silicon oxide layer by supplying hexamethyldisilazane onto said first silicon oxide layer, said molecular layer being made up of molecules containing hydrophobic groups;
    (d) depositing a second silicon oxide layer on said molecular layer by means of a chemical vapor deposition process utilizing the chemical reaction of ozone with organo-silicon; and
    (e) locally forming a second metallization layer on said second silicon oxide layer.

2. The semiconductor device fabrication method of claim 1, wherein said molecular layer is composed of a surface-active agent.

3. The semiconductor device fabrication method of claim 2, wherein said surface-active agent contains silicon or germanium.

4. The semiconductor device fabrication method of claim 1, wherein said organo-silicon is TEOS (tetra-ethyl-orthosilicate).

5. A semiconductor device fabrication method comprising the steps of:
    (a) locally forming a first metallization layer on a surface of a semiconductor substrate thereby leaving portions of said surface of said semiconductor substrate exposed;
    (b) forming a first silicon oxide layer by means of a chemical vapor deposition process in such a manner that said first silicon oxide layer covers said exposed portions of said semiconductor substrate's surface and said first metallization layer;
    (c) forming a molecular layer on said first silicon oxide layer by means of an interface reaction process in which hexamethyldisilazane is supplied onto said first silicon oxide layer by making use of a solution application or by a vapor spray, said molecular layer being made up of molecules containing hydrophobic groups;
    (d) depositing a second silicon oxide layer on said molecular layer by means of chemical vapor deposition (CVD) process utilizing the chemical reaction of ozone with organo-silicon; and
    (e) locally forming a second metallization layer on said second silicon oxide layer.

6. The semiconductor device fabrication method of claim 5, wherein said organo-silicon is TEOS (tetra-ethyl-orthosilicate).

\* \* \* \* \*

UNITED STATES PATENT AND TRADEMARK OFFICE
CERTIFICATE OF CORRECTION

PATENT NO.   : 5,950,101
DATED        : September 7, 1999
INVENTOR(S)  : Yano, et. al.

It is certified that error appears in the above-identified patent and that said Letters Patent is hereby corrected as shown below:

Title page, item [75], inventor: change "Lousaka" to --Kousaku--.

Signed and Sealed this

Seventh Day of March, 2000

Attest:

Q. TODD DICKINSON

*Attesting Officer*     *Commissioner of Patents and Trademarks*